(12) United States Patent
Burkhard et al.

(10) Patent No.: US 12,193,313 B2
(45) Date of Patent: Jan. 7, 2025

(54) NON-EQUILIBRIUM THERMAL CURING PROCESSES

(71) Applicant: Sinovia Technologies, San Carlos, CA (US)

(72) Inventors: George Burkhard, Redwood City, CA (US); Daniel Slotcavage, Menlo Park, CA (US)

(73) Assignee: Sinovia Technologies, San Carlos, CA (US)

( * ) Notice: Subject to any disclaimer, the term of this patent is extended or adjusted under 35 U.S.C. 154(b) by 342 days.

(21) Appl. No.: 16/997,677

(22) Filed: Aug. 19, 2020

(65) Prior Publication Data

US 2020/0381647 A1 Dec. 3, 2020

Related U.S. Application Data

(63) Continuation of application No. PCT/US2020/021812, filed on Mar. 10, 2020.
(Continued)

(51) Int. Cl.
*H10K 71/40* (2023.01)
*H10K 50/11* (2023.01)
(Continued)

(52) U.S. Cl.
CPC .......... *H10K 71/00* (2023.02); *H10K 50/125* (2023.02); *H10K 50/15* (2023.02); *H10K 50/171* (2023.02);
(Continued)

(58) Field of Classification Search
None
See application file for complete search history.

(56) References Cited

U.S. PATENT DOCUMENTS 6,468,590 B2 10/2002 Biebuyck et al.
7,221,093 B2 5/2007 Auch et al.
(Continued)

FOREIGN PATENT DOCUMENTS

CN 100514704 C 7/2009
JP 2016-518579 A 6/2016
(Continued)

OTHER PUBLICATIONS

International Search Report corresponding to International Application No. PCT/US20/21812 mailed Jul. 20, 2020.
(Continued)

*Primary Examiner* — Daniel Whalen

(57) ABSTRACT

A method of flash-curing a respective layer in an electronic device stack is provided. The method includes providing a stack of layers including a substrate and one or more electronically-active layers disposed on a surface of the substrate. The method further includes applying, over the stack of layers, a thermally-curable layer of material that includes a polymer or polymerizable material. The method further includes performing a non-equilibrium thermal process that includes raising a temperature of the thermally-curable layer of material, including the polymer or polymerizable material, above a first temperature for a length of time sufficient to cure the thermally-curable layer of material while maintaining the stack of layers below a second temperature that is less than the first temperature. The stack of layers is robust to temperatures below the second temperature.

16 Claims, 6 Drawing Sheets

Related U.S. Application Data

(60) Provisional application No. 62/863,038, filed on Jun. 18, 2019, provisional application No. 62/823,425, filed on Mar. 25, 2019.

(51) Int. Cl.
*H10K 50/125* (2023.01)
*H10K 50/15* (2023.01)
*H10K 50/17* (2023.01)
*H10K 71/00* (2023.01)
*H10K 71/60* (2023.01)
*H10K 50/81* (2023.01)
*H10K 50/82* (2023.01)

(52) U.S. Cl.
CPC ......... *H10K 71/441* (2023.02); *H10K 71/611* (2023.02); *H10K 50/11* (2023.02); *H10K 50/81* (2023.02); *H10K 50/82* (2023.02)

(56) References Cited

U.S. PATENT DOCUMENTS

| | | |
|---|---|---|
| 7,316,756 B2 | 1/2008 | Boroson |
| 8,304,062 B2 | 11/2012 | Khaselev et al. |
| 8,399,889 B2 | 3/2013 | Wu et al. |
| 2005/0187364 A1 | 8/2005 | Herron et al. |
| 2005/0269943 A1 | 12/2005 | Hack et al. |
| 2006/0292362 A1 | 12/2006 | Hsu et al. |
| 2007/0271808 A9 | 11/2007 | Wang et al. |
| 2011/0245429 A1 | 10/2011 | Gough et al. |
| 2015/0299358 A1* | 10/2015 | Han .................. C08F 220/62 |
| | | 525/330.3 |
| 2018/0374910 A1 | 12/2018 | Riedel et al. |
| 2019/0140180 A1* | 5/2019 | Yoshioka ............ H01L 51/0097 |
| 2019/0259956 A1* | 8/2019 | Shin .................... H10K 85/111 |

FOREIGN PATENT DOCUMENTS

| | | |
|---|---|---|
| WO | WO 2003/090260 A2 | 10/2003 |
| WO | WO 2014/177354 A1 | 11/2014 |
| WO | WO 2017/056814 A1 | 4/2017 |
| WO | WO 2017/087475 | 5/2017 |
| WO | WO-2017087475 A1 * | 5/2017 |

OTHER PUBLICATIONS

Carroll, G. T., "Photogeneration of Gelatinous Networks from Pre-Existing Polymers", J. Appl Poly Sci., v. 122, p. 168-174 (2011).

Longo, G., "Perovskite solar cells prepared by flash evaporation", Chem. Commun., v. 51, p. 7376-7378 (2015).

Japanese office action issued in corresponding application No. JP 2021-560165.

* cited by examiner

NON-EQUILIBRIUM THERMAL CURING PROCESSES

RELATED APPLICATIONS

This application is a continuation of PCT App. No. PCT/US20/21812, filed Mar. 10, 2020, which claims priority to U.S. Prov. App. No. 62/863,038, filed Jun. 18, 2019, and U.S. Prov. App. No. 62/823,425, filed Mar. 25, 2019, each of which is hereby incorporated by reference in its entirety.

TECHNICAL FIELD

Some embodiments of the present disclosure relate generally to non-equilibrium thermal curing processes ("flash curing") and, more specifically, to flash curing materials in an organic thin film device. Some embodiments of the present disclosure relate to solution-based deposition of a cathode in an organic light emitting diode (OLED).

BACKGROUND

Thin-film electronic devices, such as light emitting diodes, photovoltaic devices, and thin-film transistors, typically include a stack of layers fabricated on a substrate, including one or more electronically-active layers. The stack of layers is fabricated sequentially, with one layer being fabricated on top of the layer beneath it (e.g., by coating, printing, or a lithographic process).

It is beneficial for each layer to be fabricated as quickly and cheaply as possible. Various solution-based and/or roll-to-roll processing techniques are generally very fast and inexpensive, but not all electronic device layers have traditionally been compatible with solution-based and/or roll-to-roll processing. For example, some layers have conventionally been deposited using vapor deposition (which is slow and costly) and/or thermally-treated (e.g., cured) in furnaces (which is also slow and costly).

SUMMARY

The disclosed embodiments reduce the need for slow and costly techniques, such as vapor deposition and/or thermal-curing in a furnace, by providing methods for fabricating certain electronic device layers in a manner compatible with solution-based and/or roll-to-roll processing techniques.

(A1) To that end, a method of flash-curing a respective layer in an electronic device stack is provided. The method includes providing a stack of layers including a substrate and one or more electronically-active layers disposed on a surface of the substrate. The method further includes applying, over the stack of layers, a thermally-curable layer of material. The method further includes illuminating a surface of the stack of layers to initiate a non-equilibrium thermal process that includes raising a temperature of the thermally-curable layer of material above a first temperature for a length of time sufficient to cure the thermally-curable layer of material while maintaining the stack of layers below a second temperature that is less than the first temperature. The stack of layers is robust to temperatures below the second temperature.

(A2) In some embodiments of (A1), the stack of layers is a partial organic light emitting diode (OLED) stack.

(A3) In some embodiments of (A1), the stack of layers is a partial stack for an organic photovoltaic.

(A4) In some embodiments of (A1)-(A3), the thermally-curable layer of material comprises a cross-linkable material. Performing the non-equilibrium thermal process includes cross-linking the cross-linkable material.

(A5) In some embodiments of (A1)-(A3), the thermally-curable layer of material comprises a polymerizable material. Performing the non-equilibrium thermal process includes polymerizing the polymerizable material.

(A6) In some embodiments of (A1)-(A3), the thermally-curable layer of material is a thermally-activatable doped layer that includes a semiconducting polymer host material and a dopant. Performing the non-equilibrium thermal process includes thermally-activating the thermally-activatable doped layer.

(A7) In some embodiments of (A1)-(A6), the second temperature is a glass transition temperature for a respective layer in the stack of layers.

(A8) In some embodiments of (A1)-(A7), maintaining the stack of layers at the first temperature for the length of time sufficient to cure the thermally-curable layer of material would render the stack of layers inoperative.

(A9) In some embodiments of (A1)-(A8), the second temperature is a bulk damage threshold temperature.

(A10) In some embodiments of (A1)-(A9), the second temperature is a temperature that would cause a respective layer in the stack of layers to crack or warp.

(A11) In some embodiments of (A1)-(A10), the length of time sufficient to cure the thermally-curable layer of material at the first temperature is under 10 seconds, under 20 seconds, or under a minute, or under 10 minutes.

(A12) In some embodiments of (A1)-(A11), a length of time sufficient to cure the thermally-curable layer of material at the second temperature is over 10 minutes, over an hour, over two hours, over eight hours, over 12 hours, or over 24 hours.

(A13) In some embodiments of (A1)-(A12), the second temperature is a temperature that would cause a first amount of thermal deformation in a first layer in the stack of layers and the first amount of thermal deformation would cause a second layer in the stack of layers, different from the first layer, to crack or warp.

(A14) In some embodiments of (A13), the first layer is the substrate.

(A15) In some embodiments of (A13)-(A14), the thermal deformation is plastic deformation.

(A16) In some embodiments of (A1)-(A15), the thermally-curable layer of material is an electronically-active layer of material in the stack of layers.

(A17) In some embodiments of (A1)-(A16), the non-equilibrium thermal process results in producing a thermally-cured layer of material from the thermally-curable layer of material. The method further includes packaging an electronic device that includes the thermally-cured layer of material and an electrode disposed between the substrate and the thermally-cured layer of material. The thermally-cured layer of material is a respective layer in an electronically-active stack of layers that includes the electrode.

(B1) Further, an electronic device is provided. The electronic device includes a layer of cross-linked material formed from a cross-linkable material. The electronic device further includes a layer of second material. The layer of cross-linked material is disposed over the layer of second material. A threshold temperature for cross-linking the cross-linkable material is above a damage threshold temperature for the layer of second material. The electronic device may be fabricated in accordance with, or have any of the features described with respect to, (A1)-(A12).

(C1) Further, an electronic device is provided. The electronic device includes a layer of thermally-activated doped material comprising a semiconducting polymer host material and a dopant. The electronic device further includes a layer of second material. The layer of thermally-activated doped material is disposed over the layer of second material. A threshold temperature for thermally activating the dopant is above a damage threshold temperature for the layer of second material. The electronic device may be fabricated in accordance with, or have any of the features described with respect to, (A1)-(A12).

(D1) Further, an electronic device is provided. The electronic device includes a layer of polymerized material formed from a polymerizable material. The electronic device further includes a layer of second material. The layer of polymerized material is disposed over the layer of second material. A threshold temperature for polymerizing the polymerizable material is above a damage threshold temperature for the layer of second material. The electronic device may be fabricated in accordance with, or have any of the features described with respect to, (A1)-(A12).

(E1) Further, a method of depositing a cathode on an OLED stack is provided. The method includes providing a substrate having at least a partial OLED stack disposed on a surface of the substrate. The method further includes depositing, on top of the partial OLED stack, a solution comprising a metal compound suspended in an aliphatic solvent. The method further includes forming a conductive solid layer from the metal compound in the solution to form a cathode for the partial OLED stack.

(E2) In some embodiments of (E1), the partial OLED stack includes, in order of proximity to the substrate: an anode; a hole injection layer; a hole transport layer; a light emission layer; an electron transport layer; and an electron injection layer.

(E3) In some embodiments of (E1)-(E2) the anode is a transparent conductive layer.

(E4) In some embodiments of (E1)-(E3) the partial OLED stack is part of a bottom-emitting OLED stack.

(E5) In some embodiments of (E1)-(E4), the metal compound comprises a silver (Ag) compound or an aluminum (Al) compound.

(E6) In some embodiments of (E1)-(E5), the cathode is reflective.

(E7) In some embodiments of (E1)-(E6), the cathode has a conductivity between 0.001-1.0Ω/□/mil.

(E8) In some embodiments of (E1)-(E7), the partial OLED stack covers a contiguous area on the substrate that is at least 1 cm².

(E9) In some embodiments of (E1)-(E8), the partial OLED stack includes an anode comprising a material other than indium tin oxide (ITO).

(E10) In some embodiments of (E1)-(E9), the partial OLED stack consists of a plurality of layers. The method further includes fabricating the partial OLED stack using solution-based processing to form each layer in the partial OLED stack, including depositing a transparent conductive layer using solution-based processing to form an anode for the partial OLED stack.

(E11) In some embodiments of (E1)-(E10), the solution comprising the metal compound is deposited using roll-to-roll processing.

(E12) In some embodiments of (E1)-(E11), the metal compound comprises conductive particles functionalized to be soluble in the aliphatic solvent.

(E13) In some embodiments of (E1)-(E12), the partial OLED stack consists of a plurality of layers. Each layer of the plurality of layers of the partial OLED stack is insoluble to the aliphatic solvent.

(E14) In some embodiments of (E1)-(E13), the metal compound comprises conductive particles. Forming the conductive solid layer from the solution to form the cathode for the partial OLED stack comprises thermally curing the solution.

(F1) Further, a method of depositing a cathode on an OLED stack is provided. The method includes providing a substrate having at least a partial organic light emitting diode (OLED) stack disposed on a surface of the substrate; depositing, on top of the partial OLED stack, a solution comprising a metal and a reducing agent; and reducing the metal to precipitate the metal out of the solution. In some embodiments, the solution comprises a metal compound that includes the metal, wherein the metal is not in a metallic state in the metal (e.g., has an oxidation state other than an oxidation state in which the metal element is metallic).

(F2) In some embodiments of (F1), the partial OLED stack includes, in order of proximity to the substrate: an anode, a hole injection layer, a hole transport layer, a light emission layer, an electron transport layer, and an electron injection layer.

(F3) In some embodiments of (F2), the anode is a transparent conductive layer.

(F4) In some embodiments of (F1)-(F3), the partial OLED stack is part of a bottom-emitting OLED stack.

(F5) In some embodiments of (F1)-(F4), the metal comprises silver (Ag) or aluminum (Al).

(F6) In some embodiments of (F1)-(F5), the cathode is reflective.

(F7) In some embodiments of (F1)-(F6), the cathode has a conductivity between 0.001-1.0Ω/□/mil.

(F8) In some embodiments of (F1)-(F7), the partial OLED stack covers a contiguous area on the substrate that is at least 1 cm².

(F9) In some embodiments of (F1)-(F8), the partial OLED stack includes an anode comprising a material other than indium tin oxide (ITO).

(F10) In some embodiments of (F1)-(F9), the partial OLED stack consists of a plurality of layers. The method further includes: fabricating the partial OLED stack using solution-based processing to form each layer in the partial OLED stack, including depositing a transparent conductive layer using solution-based processing to form an anode for the partial OLED stack.

(F11) In some embodiments of (F1)-(F10), the solution comprising the metal and the reducing agent is deposited using roll-to-roll processing.

(F12) In some embodiments of (F1)-(F11), the partial OLED stack consists of a plurality of layers, the solution comprises a solvent, and each layer of the plurality of layers of the partial OLED stack is insoluble in the solvent.

(G1) Further, an electronic device is provided. The device includes a substrate and a partial OLED stack disposed on a surface of the substrate. The partial OLED stack includes, in order of proximity to the substrate: an anode; and one or more active layers. The electronic device further includes a cathode comprising a solid layer of sintered conductive particles. The electronic device may be fabricated in accordance with, or have any of the features described with respect to, (E1)-(E14) or (F1)-(F12).

BRIEF DESCRIPTION OF DRAWINGS

Like reference numerals refer to corresponding parts throughout the drawings.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1A:
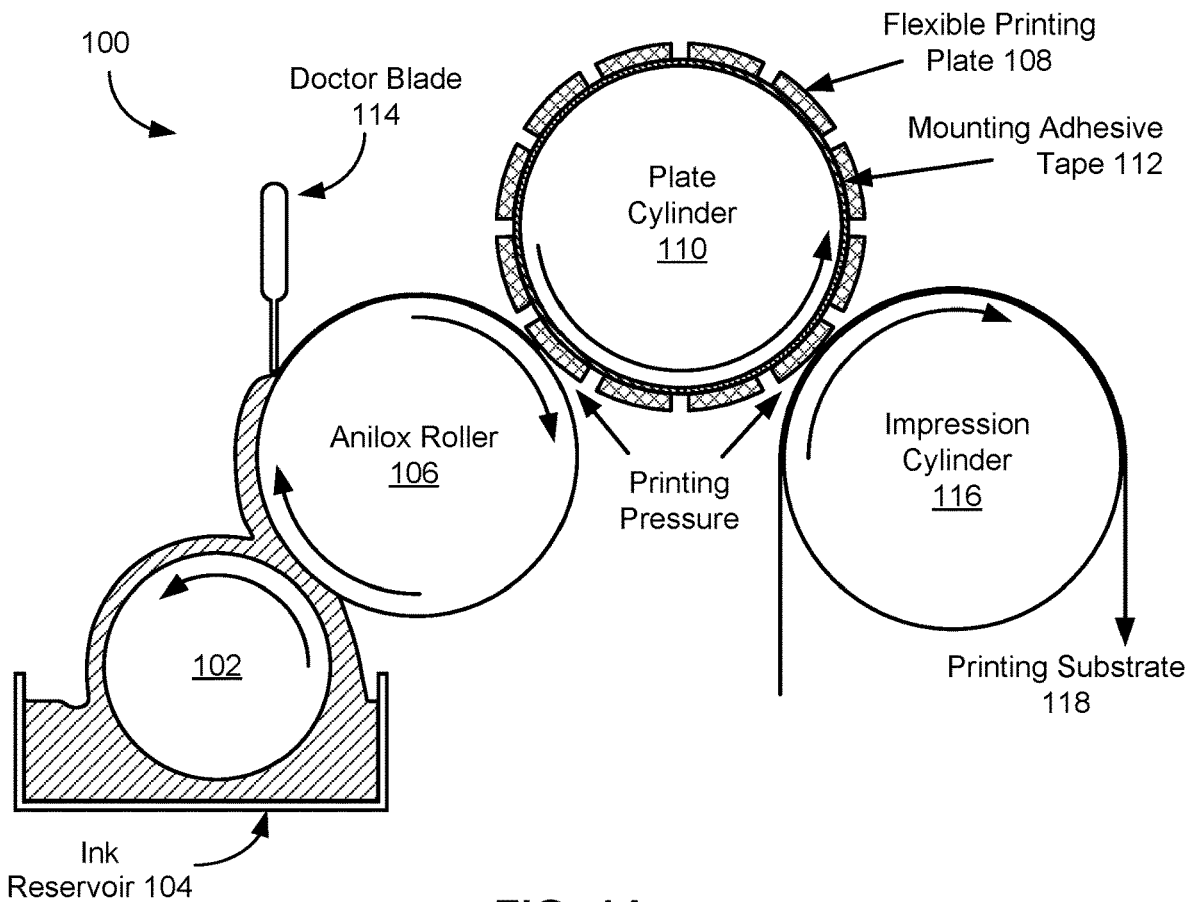
FIGS. 1A-1B illustrate a roll-to-roll processing setup for at least partially fabricating electronic devices, in accordance with some embodiments.
Figure 1B:
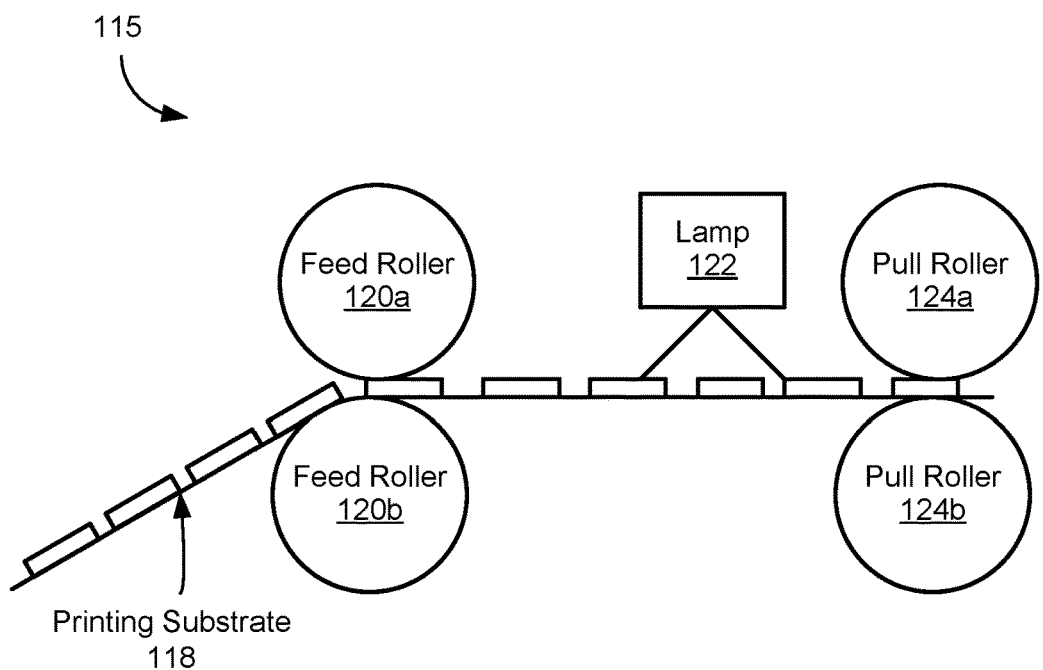

FIGS. 1A-1B illustrate a roll-to-roll processing setup for at least partially fabricating electronic devices, in accordance with some embodiments.

FIG. 1A illustrates a flexography setup 100 for printing electronically-active layers (and other layers), in accordance with some embodiments. Although flexography is used as an example of roll-to-roll processing, one of skill in the art having had the benefit of this disclosure will recognize that other roll-to-roll processes for coating and printing device materials are also applicable. Such processes include, depending on the application, slot die coating, gravure coating, micro-gravure coating, roll coating, comma coating, bar coating, rod coating, knife coating, blade coating, slide coating, curtain coating, spray coating, rotary screen printing, ink jet printing, and others.

The flexography setup 100 includes a fountain roller 102. The fountain roller 102 transfers ink located in an ink pan 104 to an anilox roller 106. In modern flexographic printing, the anilox roller 106 is sometimes referred to as a metering roller.

The anilox roller 106 is responsible for transferring ink to a flexible printing plate 108 mounted on a plate cylinder 110. In some embodiments, the anilox roller 106 transfers a uniform thickness of ink to a flexible printing plate 108 mounted on a plate cylinder 110 (e.g., the anilox roller 106 has finely engraved cells with a particular ink capacity). In some embodiments, an optional doctor blade 114 scrapes the anilox roller 106 to ensure that the ink to be delivered to the flexible printing plate 108 is only what is contained within the engraved cells.

In some embodiments, the flexible printing plate 108 is made from a soft flexible rubber-like material. In some embodiments, the flexible printing plate 108 is held to the plate cylinder 110 using a mounting adhesive tape 112. In other embodiments, the flexible printing plate 108 is held to the plate cylinder 110 using magnets, tension straps, and/or ratchets.

The flexography setup 100 further includes an impression cylinder 116 (also called a "print anvil") that applies pressure to the plate cylinder 110. In this manner, an ink image of the flexible printing plate 108 is transferred to the printing substrate 118. In some embodiments, the ink is a solution from which a respective layer in a stack of layers is formed (e.g., any of the layers described with respect to subsequent figures). In some embodiments, the printing substrate 118 is used as the substrate in method 400 (FIG. 4) and method 500 (FIGS. 5A-5B), described below.

In some circumstances, the ink printed onto the printing substrate 118, as shown in FIG. 1A, needs to be cured. To that end, FIG. 1B illustrates a photonic curing setup 115, in accordance with some embodiments. The photonic curing setup 115 includes a pair of feed rollers (e.g., feed roller 120a and feed roller 120b) through which the printing substrate 118 is fed. The printing substrate 118 is then exposed to (illuminated with) radiation from a lamp 122, which cures the ink on the printing substrate 118 (e.g., by initiating a UV-curing or thermal-curing process). In some embodiments, as described with reference to FIGS. 2A-2C and method 400 (FIG. 4), the lamp 122 is a flash-curing lamp (e.g., a xenon flash-curing lamp), which deposits energy in the top surface of the printing substrate 118 (e.g., in the form of photons). The printing substrate 118, once cured, is then fed through a pair of pull rollers (e.g., pull roller 124a and pull roller 124b). In some embodiments, additional (e.g., subsequent) device layers can be printed on top of the cured ink by repeating the process shown in FIGS. 1A-1B.

Figure 2A:
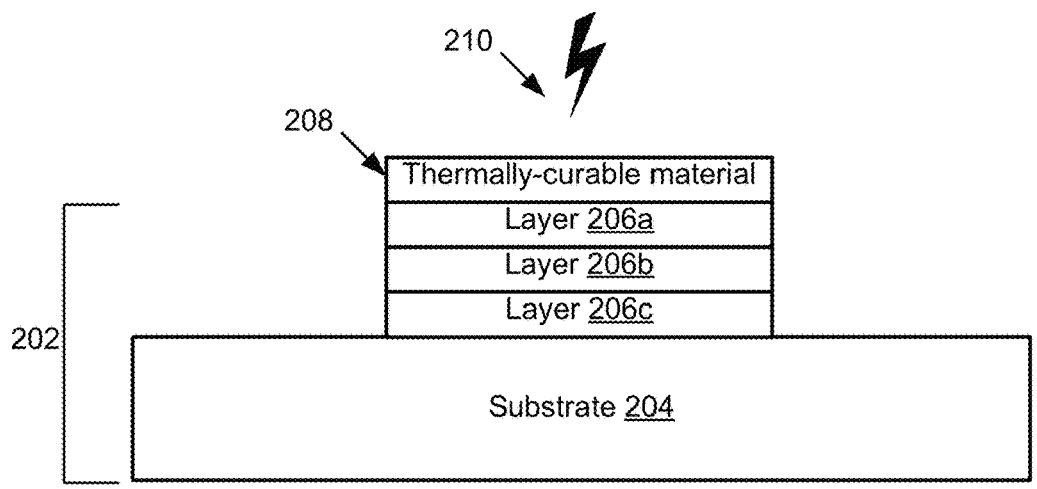
FIGS. 2A-2C illustrate a non-equilibrium thermal curing process, in accordance with some embodiments.
Figure 2B:
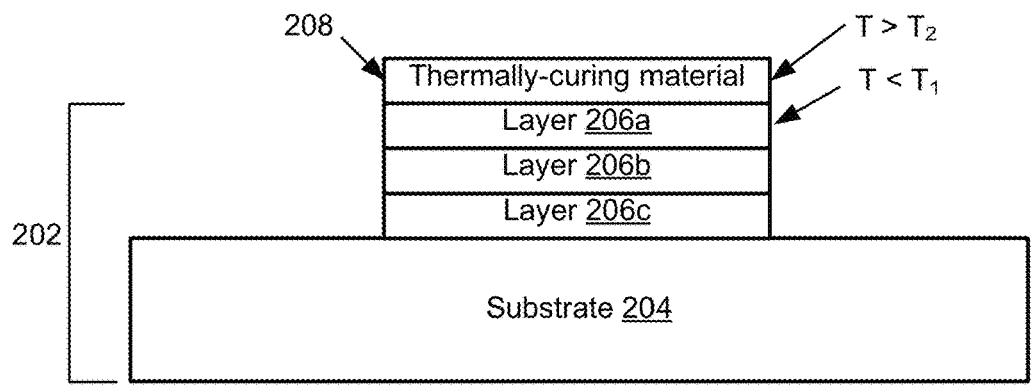
Figure 2C:
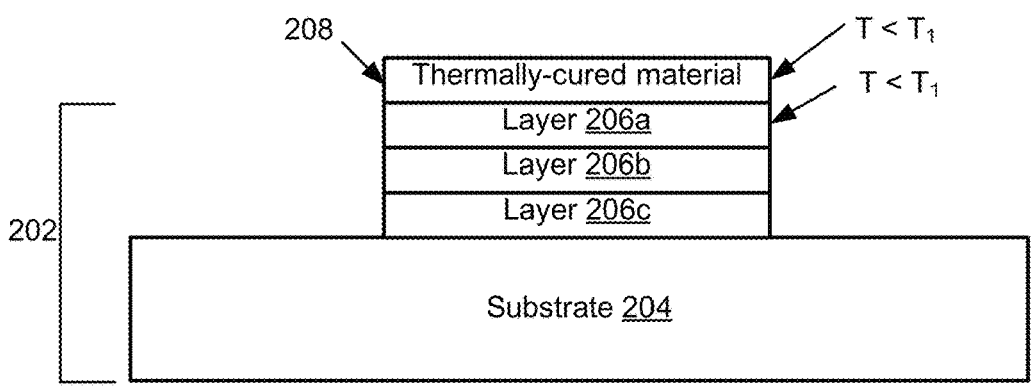

FIGS. 2A-2C illustrate a non-equilibrium thermal curing process (e.g., a flash-curing process), in accordance with some embodiments. In FIG. 2A, a stack of layers 202 is provided that includes a substrate 204 and one or more electronically-active layers disposed on a surface of the substrate. For example, one or more of layer 206a, layer 206b, and layer 206c are electronically-active layers. A thermally-curable layer of material 208 is applied over the stack of layers 202. Light 210 from a flash-curing lamp (e.g., lamp 122, FIG. 1) is incident upon the thermally-curable layer of material 208.

Note that, in some embodiments, the thermal curing processes described herein are considered non-equilibrium thermal processes when two layers of the stack are at substantially different temperatures for a duration needed to complete the curing process. For example, as described below, in some embodiments, a curable layer is raised above a first temperature and a different layer is maintained below a second temperature, less than the first, where the device is robust to the second temperature. Because the first temperature and the second temperature are different, the process is considered a non-equilibrium thermal process.

To that end, as shown in FIG. 2B, with flash-curing, the energy is deposited quickly (less than the thermalization time), and only in the top surface (e.g., in the thermally-curable layer of material 208), where substantially all of the light 210 is absorbed. This allows the top surface (e.g., the thermally-curable layer of material 208), to heat to high temperatures (e.g., >500° C.), but as that energy thermalizes into the stack of layers 202 below (including the substrate), the temperature (T) of the top surface decreases and the temperature of the substrate increases. But since the heat capacity of the substrate is much greater than the heat capacity of the surface, the temperature of the stack of layers 202 only rises a small amount (e.g., below a damage threshold for the stack of layers 202), which can prevent thermal damage to other layers while still curing the thermally-curable layer of material 208 at a high temperature.

FIG. 2C illustrates the resulting structure. More specifically, FIG. 2C illustrates an electronic device 212 that includes a layer of thermally-cured material 208 formed from a thermally-curable material (e.g., a cross-linked material formed from a cross-linkable material; a polymerized material formed from a polymerizable material; and/or a thermally-activated doped material that includes a semiconducting polymer host material and a dopant). The electronic device further includes a layer of second material (e.g., any of layer 206a, layer 206b, and/or layer 206c). The layer of thermally-cured material 208 is disposed over the layer of second material. A threshold temperature for thermally-curing the material 208 is above a damage threshold temperature for the layer of second material. Note that the electronic device may include subsequent layers (not shown, but analogous to barrier layer 314, FIG. 3B), such as additional electronically-active layers, as well as barrier layers, to protect the electronic device (in other words, the thermally-cured layer need not be the top layer of the electronic device).

Figure 3A:
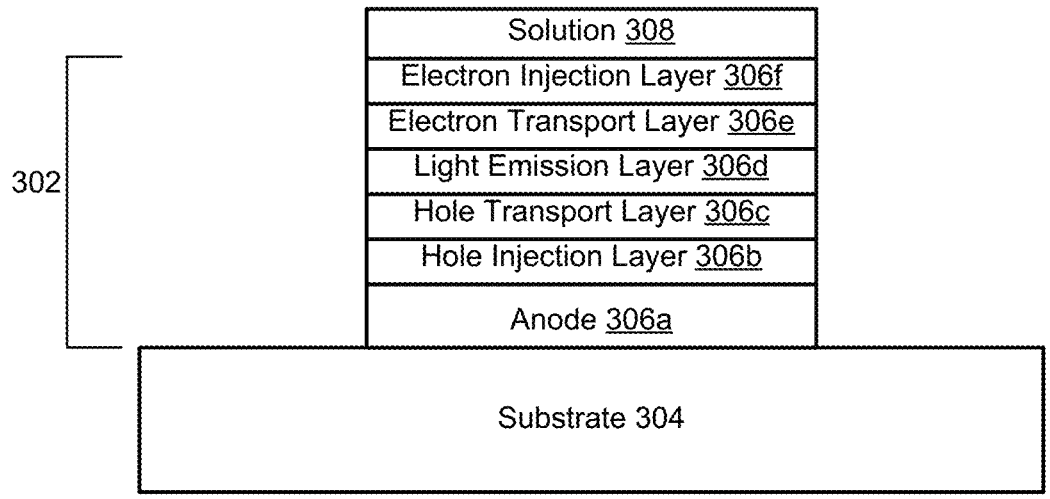
FIGS. 3A-3B illustrate a solution-based process for depositing a cathode on top of a stack of layers, in accordance with some embodiments.
Figure 3B:
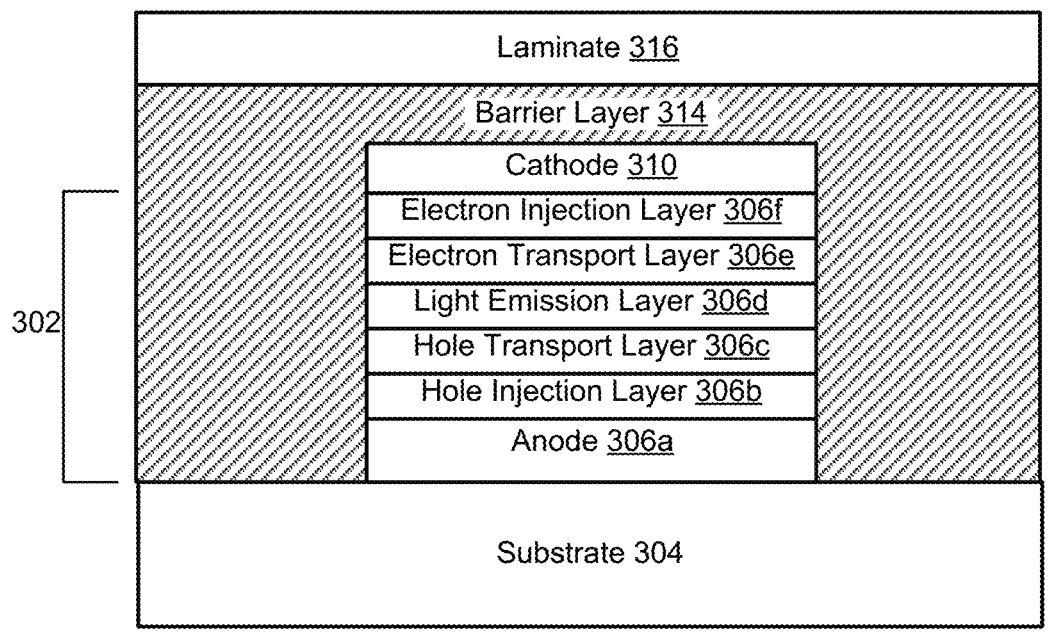

FIGS. 3A-3B illustrate a solution-based process for depositing a cathode on top of a stack of layers, in accordance with some embodiments. In particular, FIGS. 3A-3B illustrate an example of a solution-based process for depositing a cathode for a bottom-emitting OLED. In FIG. 3A, a substrate 304 having at least a partial OLED stack 302 disposed on a surface of the substrate 304 is provided. For example, the partial OLED stack 302 includes one or more of: an anode 306a, a hole injection layer 306b, a hole transport layer 306c, a light emission layer 306d, an electron transport layer 306e, and an electron injection layer 306f. In some embodiments, the partial OLED stack includes a plurality of the aforementioned layers, and does not include at least one of the aforementioned layers. For example, in some embodiments, the partial OLED stack does not include a hole transport layer and/or an electron transport layer. In some embodiments, each of the layers in the partial OLED stack is solution processed (e.g., processed using roll-to-roll processing). In some embodiments, more than 3 of the layers in the stack are solution processed. Note that, as more of the layers are solution processed, it becomes more and more difficult the find orthogonal chemistries such that the application of a layer will not damage a previously-deposited layer. Some embodiments described herein provide methods of depositing a solution-process silver or aluminum cathode using chemistries (e.g., aliphatic solvents or Tollen's reactions) that do not damage three or more solution-processed layers already deposited in the stack. In some embodiments, the one or more solution-processed (or solution-processable) layers are susceptible to dissolution in any of a class of solvents that includes: alcohols, esters, aldehydes, ethers, ketones, aromatics, and polar protic solvents.

For example, in some embodiments, an example partial OLED stack is produced using the following corresponding solvents (placed in parenthesis): an anode (water), a hole injection layer (an alcohol-based solvent), a light emission layer (aromatic solvent), electron accepting layer (an ether solvent).

A solution 308 comprising a metal compound (e.g., a silver (Ag) or aluminum (Al) compound) is deposited on top of the partial OLED stack. In some embodiments, the solution further includes a solvent, wherein none of the layers in the partial OLED stack is soluble in the solvent (e.g., either because the layer has been cross-linked or because the layer is naturally insoluble in the particular solvent). A cathode 310 for the partial OLED stack is formed from the metal compound. For example, in some embodiments, the metal compound comprises metallic particles (e.g., nanoparticles) and the cathode is formed by thermally-curing the solution to sinter the metallic particles together. Alternatively, the cathode is formed using a Tollens' reaction to reduce a metal in the metal compound to a metallic state. As used herein, the term compound is intended to cover any substance that includes said metal in any oxidation state (e.g., nanoparticles in which the metal is in a metallic state, a dissolved metal salt in which the metal is not in a metallic state).

FIG. 3B illustrates the resulting structure. More specifically, FIG. 3B illustrates a bottom-emitting OLED 312. The bottom-emitting OLED 312 includes the substrate 304 and the partial OLED stack 302 disposed on a surface of the substrate 304. For example, the partial OLED stack includes one or more of, in order of proximity to the substrate: anode 306a and one or more active layers. For example, the one or more active layers include one or more of the hole injection layer 306b, the hole transport layer 306c, the light emission layer 306d, the electron transport layer 306e, and the electron injection layer 306f. The bottom-emitting OLED 312 further includes a cathode 310. In some embodiments, the cathode 310 comprises a solid layer of sintered conductive particles (e.g., a porous metallic layer). In some embodiments, the cathode 310 comprises a crystalline layer of metal having a characteristic grain size indicative of a Tollens' reaction.

In some embodiments, additional layers may be applied to the bottom-emitting OLED 312. For example, the bottom-emitting OLED 312 shown in FIG. 3B includes a barrier layer 314 and a laminate 316, which protect the bottom-emitting OLED 312 from physical damage and, for example, water damage.

It should be noted that, in some embodiments, the stack shown in FIGS. 3A-3B is inverted, such that the anode is on top (e.g., the OLED is a top-emitting OLED). In some embodiments, the anode is a silver anode deposited in accordance with the embodiments described herein.

Figure 4:
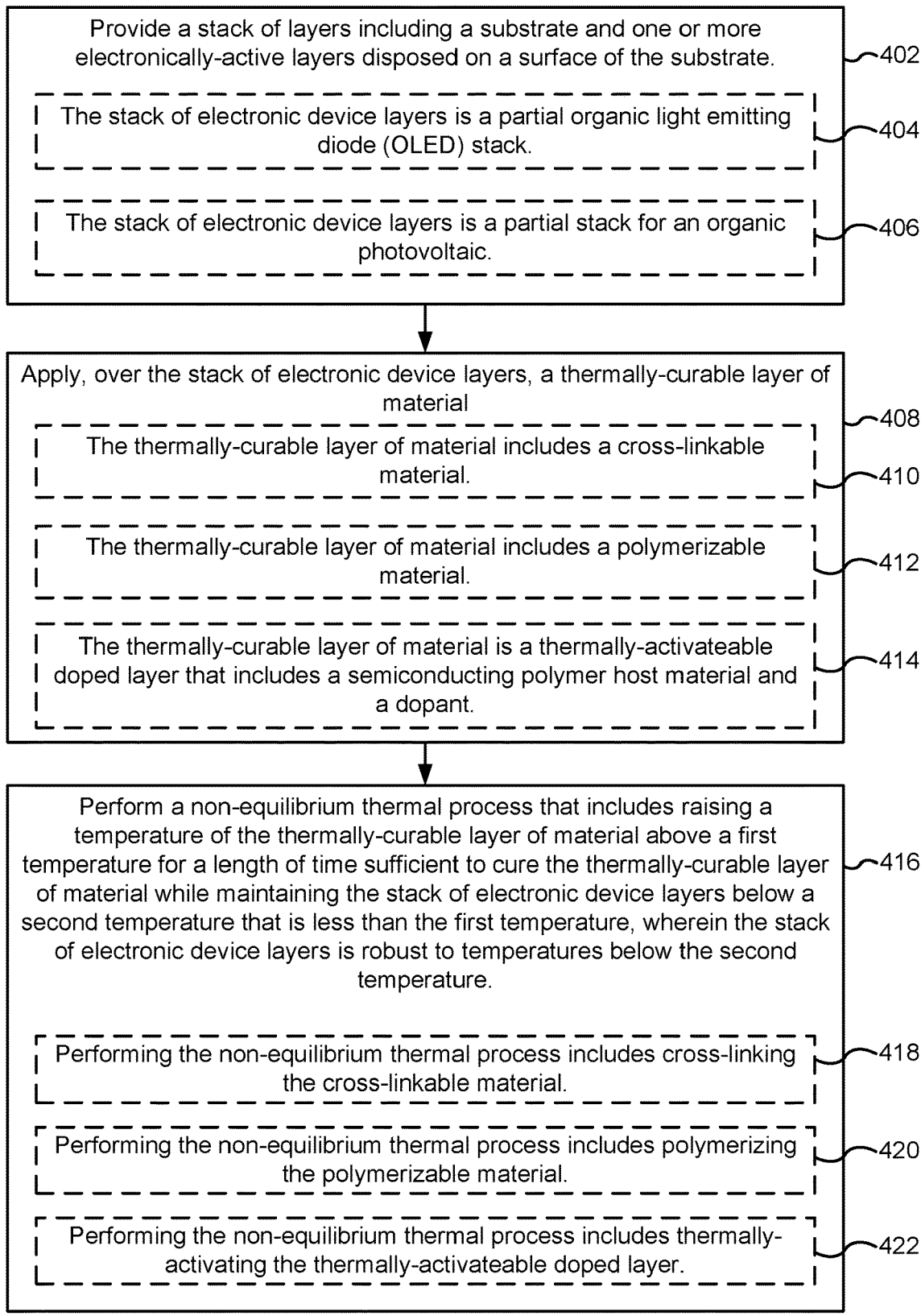
FIG. 4 illustrates a flowchart for a method of thermally curing a layer in a stack of layers, in accordance with some embodiments.

FIG. 4 illustrates a flowchart for a method 400 of thermally curing a layer in a stack of layers, in accordance with some embodiments. Various operations described with reference to method 400 may optionally be combined with other methods and processes described herein, such as the method 500 described below with reference to FIGS. 5A-5C.

Various electronic devices, such as OLEDs, are fabricated by creating a stack of a layers on a substrate (e.g., one-by-one, through lithographic, coating, and/or printing processes). It is often necessary during the fabrication of such electronic devices to perform a thermal process on one of the layers, for example, to polymerize, cross-link, or dope a layer. Thus, when performing thermal processes by raising the bulk temperature of the stack (e.g., by placing the stack in a furnace), the other layers in the stack have to be robust to the thermal treatment (e.g., the other layers cannot be irreversibly damaged by the thermal treatment such that the electronic device would not work or would have an unacceptable lifetime). For example, such damage may occur to a particular layer when that particular layer increases in temperature above a damage threshold (e.g., a temperature at which the layer decomposes). Such damage can also result from differential thermal expansion between various layers that causes mechanical failure. For example, in some cases, a plurality of thin films (e.g., roughly 50 nm in thickness) are stacked on top of a thick (e.g., 50 micron thick) substrate. If the substrate heats appreciably, it expands, taking the stack with it, and causing cracks in electronically-active layers and/or barrier layers.

One solution is to use thermally robust layers in the stack, but such thermally-robust layers are expensive. Another solution is to perform the thermal processes at lower temperature, but doing so may slow the thermal process to the point where it is no longer viable on a production scale.

In some embodiments of the present disclosure, non-equilibrium thermal processes (e.g., flash-curing processes) are used to overcome the problems described above. In a flash-curing process, a layer of material (e.g., a cross-linkable material, a polymerizable material, or a doped material) is irradiated at its surface using a flash-curing lamp (e.g., a xenon flash-curing lamp). The energy from the flash-curing lamp is deposited quickly (e.g., less than a thermalization time), and only in a top layer of the surface (e.g., the energy is deposited in a layer in which light is substantially absorbed). This allows the top layer of the surface to heat to high temperatures (e.g., >500° C.), but as that energy thermalizes into the underlying layers below, the temperature of the underlying layers rises only a small amount. Thus, the non-equilibrium thermal processes of the present disclosure allow the flash-cured layer to reach the necessary temperature to perform a thermal process without damaging the underlying layers. Using these flash-curing processes, devices can be manufactured with less thermally-stable underlying structures without a concomitant increase in processing time, reducing the product cost by almost an order of magnitude.

For example, such embodiments may be used to cross-link, polymerize, or activate a dopant in a layer in an OLED stack without damaging the underlying layers. One of skill in the art having the benefit of this disclosure will recognize, however, that the embodiments described herein may be used to fabricate other thin-film devices (e.g., organic thin-film devices) in which thermal treatment of a layer is rate-limited by the thermal sensitivities of one or more underlying layers. Such devices include, but are not limited to, thin film solar devices (e.g., organic photovoltaics), thin film transistors deposited on plastic substrates, and other devices fabricated on low cost flexible substrates such as touch sensors, transparent displays of types other than OLEDs, etc.

To that end, the method 400 includes providing (402) a stack of layers including a substrate and one or more electronically-active layers disposed on a surface of the substrate. In some embodiments, the substrate is an organic substrate (e.g., a plastic, such as polyethylene terephthalate (PET)). In some embodiments, the substrate is flexible. In some embodiments, the substrate is suitable for roll-to-roll processing. In some embodiments, providing the substrate includes providing, to a roll-to-roll processing apparatus, the substrate as a roll (e.g., as a reel).

In some embodiments, the stack of layers is (404) a partial OLED stack. In some embodiments, the stack of layers is (406) a partial stack for an organic photovoltaic. One of skill in the art, however, will recognize that method 400 is applicable to any number of devices (e.g., thin film devices), such as thin film transistors deposited on plastic substrates, touch sensors, transparent displays of types other than OLEDs, etc.

The method 400 further includes applying (408), over the stack of layers, a thermally-curable layer of material. In some embodiments, applying the thermally-curable layer of material includes slot die coating, gravure coating, microgravure coating, roll coating, comma coating, bar coating, rod coating, knife coating, blade coating, slide coating, curtain coating, spray coating, rotary screen printing, ink jet printing, and others.

In some embodiments, the thermally-curable layer of material comprises an organic material. In some embodiments, the thermally-curable layer of material comprises (410) a cross-linkable material. In some embodiments, the thermally-curable layer of material (412) comprises a polymerizable material. In some embodiments, the thermally-curable layer of material is (414) a thermally-activatable doped layer that includes a semiconducting polymer host material and a dopant.

The method 400 further includes performing (416) a non-equilibrium thermal process that includes raising a temperature of the thermally-curable layer of material (e.g., a temperature of at least a portion of the thermally-curable layer of material) above a first temperature for a length of time sufficient to cure the thermally-curable layer of material (e.g., at least a portion of the thermally-curable layer of material, where the portion is adequate to be electronically-functional in the electronic device) while maintaining the stack of layers below a second temperature that is less than the first temperature (e.g., no portion of the stack of device layers is above the second temperature, and/or no respective portion of the stack of layers is above a damage threshold temperature for that respective portion). The stack of layers is robust to temperatures below the second temperature. In some embodiments, the stack of layers is not robust to temperatures above the second temperature (at least for a length of time sufficient to cure the thermally-curable layer of material). In some embodiments, a second layer in the stack of layers is not robust to temperatures above the second temperature (at least for a length of time sufficient to cure the thermally-curable layer of material). In some embodiments, the thermally-curable layer of the material is directly on top of the second layer. In some embodiments, there are one or more intervening layers between the thermally-curable layer and the second layer. In some embodiments, the thermally-curable layer is deposited after the second layer. In some embodiments, the second layer is substantially transparent to light (e.g., optical light).

In some embodiments, performing the non-equilibrium thermal process includes illuminating a surface of the stack of device layers to initiate the non-equilibrium thermal process. In some embodiments, performing the non-equilibrium thermal process includes illuminating a surface of the layer of thermally-curable material to initiate the non-equilibrium thermal process. In some embodiments, the surface is illuminated with a lamp.

In some embodiments, the stack of layers is considered robust to a respective temperature (for a respective amount of time) when the resulting (e.g., packaged device) has a predefined yield with a predefined lifetime. For example, in some embodiments, the predefined yield is 90% and the predefined lifetime is one year (e.g., under expected operating conditions). In some embodiments, the predefined yield is 90% and the predefined lifetime is two weeks.

In some embodiments, performing the non-equilibrium thermal process includes irradiating a surface of the thermally-curable layer of material using a flash lamp (e.g., a xenon flash lamp to photonically-cure, or "flash-cure" the thermally-curable layer of material). In some embodiments, performing the non-equilibrium thermal process includes (418) cross-linking the cross-linkable material (e.g., the first temperature is a cross-linking threshold temperature at which a substantial amount of cross-linking occurs (e.g., 90% of the possible cross-linking)). In some embodiments, the cross-linkable material is soluble before it is cross-linked and insoluble after it is cross-linked (e.g., in whatever solvent are used in the manufacturing process). In some embodiments, the method includes, after performing the non-equilibrium thermal process, applying an additional layer on top of the thermally-cured layer of material, wherein the additional layer includes a solvent. The thermally-curable layer of material is soluble in the solvent before performing the non-equilibrium thermal process and insoluble after performing the non-equilibrium thermal process.

In some embodiments, the first temperature is greater than 190° C., 200° C., 300° C., 400° C., or 500° C. In some embodiments, the second temperature is less than 100° C., 150° C., or 200° C.

In some embodiments, performing the non-equilibrium thermal process includes (420) polymerizing the polymerizable material (e.g., the first temperature is a polymerization threshold temperature at which a substantial amount of polymerization occurs (e.g., 90% of the possible polymerization).

In some embodiments, performing the non-equilibrium thermal process includes (422) thermally-activating the thermally-activatable doped layer (e.g., the first temperature is a dopant activation threshold temperature, e.g., a charge carrier density of the material is increased by performing the non-equilibrium thermal process).

In some embodiments, the first temperature is 500° C. or greater. In some embodiments, the second temperature is a damage threshold temperature for the stack of layers that is less than the first temperature. For example, in some embodiments, the damage threshold temperature is roughly 150° C. Note that there may be myriad ways that the stack of layers could be irreversibly damaged if the temperature were raised too high, and thus myriad corresponding damage threshold temperatures. For example, in some embodiments, the second temperature is a glass transition temperature for a respective layer in the stack of layers (e.g., the respective layer would simply melt if it were exposed to temperatures above the glass transition temperature). In some embodiments, the second temperature is a bulk damage threshold temperature (e.g., maintaining the stack of layers at the first temperature for the length of time sufficient to cure the thermally-curable layer of material would render the stack of layers inoperative). Stated another way, the bulk damage threshold temperature is a temperature at which the stack of layers would be irreversibly damaged if placed in a furnace at that temperature for the length of time sufficient to cure the thermally-curable layer of material.

In some embodiments, the second temperature is a temperature that would cause a respective layer in the stack of layers to crack or warp. For example, at the second temperature, thermal expansion (deformation) of the substrate may cause the substrate to crack or warp, which in turn causes one or more of the electronically-active layers to crack or warp, rendering the device inoperable. Alternatively, melting and re-solidifying one layer in the stack of layers may cause a different layer in the stack of layers to crack or warp.

In some embodiments, the second temperature is a temperature that would cause a first amount of thermal deformation in a first layer in the stack of layers. The first amount of thermal deformation would cause a second layer in the stack of layers, different from the first layer, to crack or warp. In some embodiments, the first layer is the substrate. In some embodiments, the thermal deformation is plastic deformation. For example, raising the substrate to the second temperature for any appreciable amount of time may cause the substrate to plastically deform (e.g., stretch), which could cause small cracks in one or more layers disposed on top of the substrate (e.g., a barrier layer). The small cracks may limit the lifetime of the device below an acceptable threshold, for example, by allowing moisture into the device.

In some embodiments, the thermally-curable layer of material is an electronically active layer of material in the stack of layers. In some embodiments, the non-equilibrium thermal process results in producing a thermally-cured layer of material from the thermally-curable layer of material and the method further includes packaging an electronic device that includes the thermally-cured layer of material and an electrode disposed between the substrate and the thermally-cured layer of material, wherein the thermally-cured layer of material is a respective layer in an electronically-active stack of layers that includes the electrode. For example, in some embodiments, there is no thermally-protective layer between the thermally-cured layer of material and other layers in the stack of layers that would be damaged if raised to the first temperature. One reason that the stack of layers does not include a thermally-protective layer is that it is often difficult or impossible to form a thermally-protective layer in the middle of a stack for an electronic device (e.g., an OLED) stack that maintains the electrical properties necessary for the function of the electronic device.

Note that, in some embodiments, the stack of layers is robust to the first temperature, as well, and the flash-curing methods described herein are used to speed up the curing process.

Note that, in some embodiments, the cross-linking (or polymerization, or dopant activation) threshold temperature is well-below the first temperature and, indeed, may be below the damage threshold temperature (e.g., the second temperature). When the cross-linking (or polymerization, or dopant activation) threshold temperature is below the damage threshold temperature, the cross-linking (or polymerization, or dopant activation) could be performed below the damage threshold temperature, but a length of time sufficient to cure the thermally-curable layer of material at the second temperature is over 10 minutes, over an hour, over two hours, over eight hours, over 12 hours, or over 24 hours (e.g., too long for roll-to-roll processing). In contrast, in some embodiments, the length of time sufficient to cure the thermally-curable layer of material at the first temperature is under 10 seconds, under 20 seconds, under a minute, or under 10 minutes.

Figure 5A:
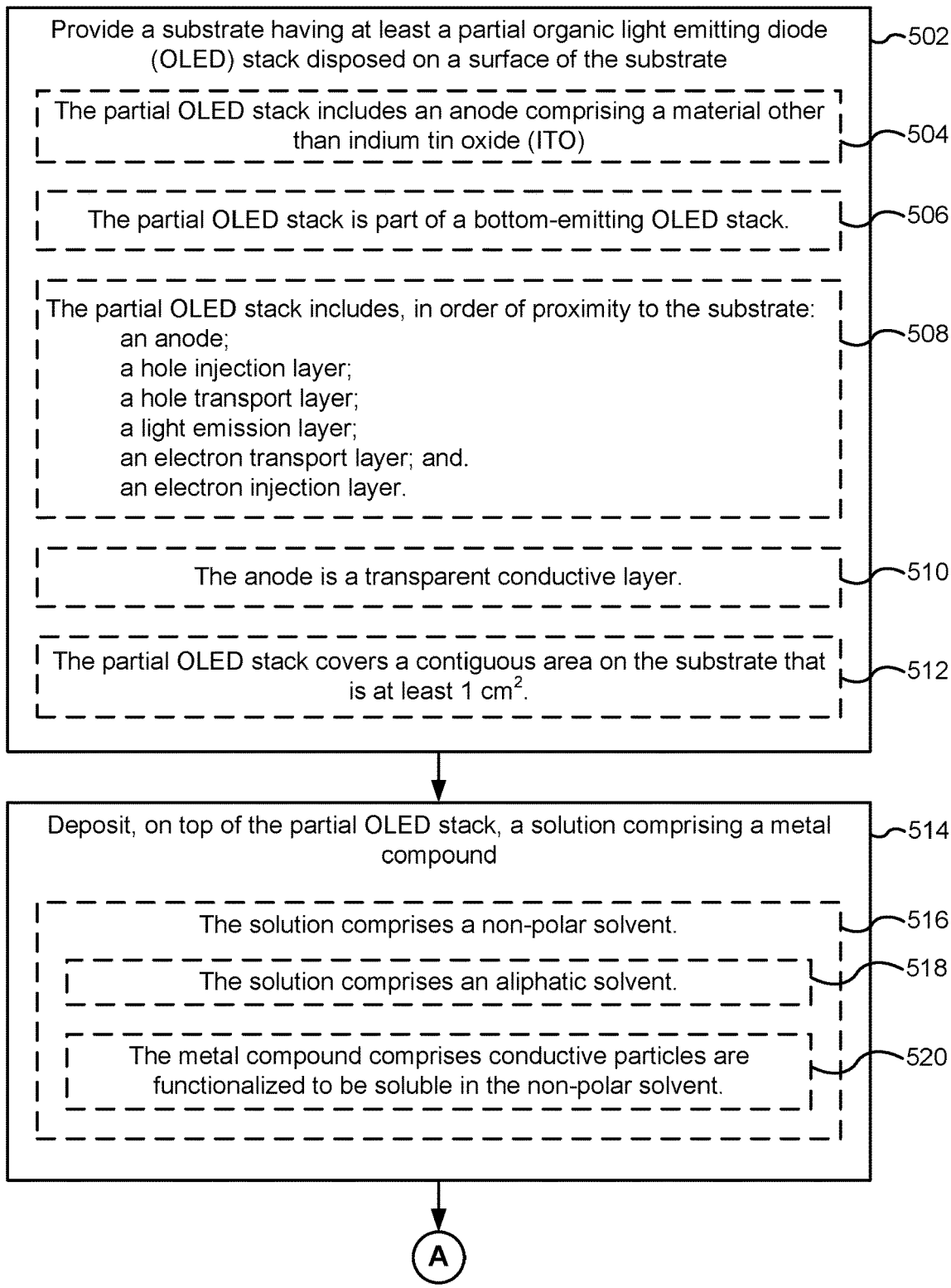
FIGS. 5A-5B illustrate a flowchart for a method of solution-based deposition of a cathode on top of a partial OLED stack, in accordance with some embodiments.
Figure 5B:
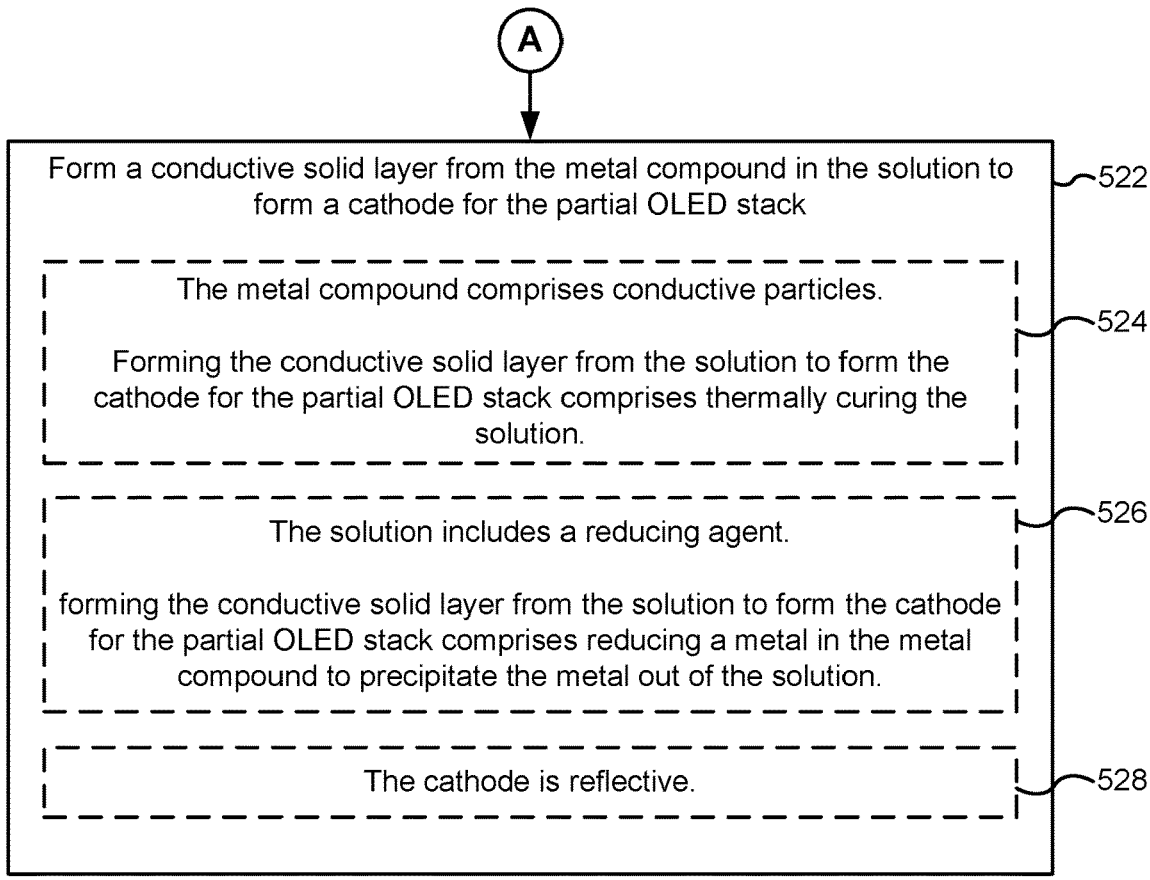

FIGS. 5A-5B illustrate a flowchart for a method 500 for solution-based deposition of a cathode on top of an OLED stack, in accordance with some embodiments. Various operations described with reference to method 500 may optionally be combined with other methods and processes described herein, such as the method 400 described above with reference to FIG. 4.

In fabricating a solution-processed device, it is essential that the solvent in a given layer not dissolve the layers beneath it. This is accomplished by using solvents that are orthogonal to those of the underlying layers, or by making one or more of the layers insoluble, as through cross-linking. In an ideal world, all of these materials could be made cross-linkable, so that solvent choice would not be an issue. However, because these are electronically-active materials, and the ability to cross-link requires additional functional chemistry, most of the layers are made from materials which cannot be made cross-linkable, or otherwise insoluble.

Because the cathode is the final layer in a bottom-emitting OLED stack, it is the hardest to design, since it must not dissolve any of the layers beneath it (which typically consists of 3-5 layers). For this reason, in conventional solution-processed bottom-emitting OLED stacks, the cathode is not solution processed. That is, most OLED cathodes are metal films, whereas most solution processable metals are include nanoparticles suspended in a solvent. To stabilize the metal particles (which have mobile electrons), a polar solvent generally must be used. This causes problems because there are layers in a typical OLED stack which are soluble in polar solvents.

Rather, in a typical OLED fabrication process, the cathode is deposited via a vacuum deposition process (e.g., physical vapor deposition). However, vacuum deposition processes are significantly slower and more costly than solution-based processes, which as noted above can be performed using roll-to-roll processing.

The method 500 reduces or mitigates these problems by using solvents for which the materials stack is immune (e.g., aliphatic solvents). With the proper surface functionalization of the nanoparticles (by attaching ligands to their surface that change the electronic properties of the surface), the nanoparticles can be suspended in such non-polar aliphatic solvents (e.g., C14-C16 variants, or shorter).

To that end, the method 500 includes providing (502) a substrate having at least a partial OLED stack disposed on a surface of the substrate. In some embodiments, the partial OLED stack consists of a plurality of layers. In some embodiments, the substrate is an organic substrate (e.g., a plastic, such as polyethylene terephthalate (PET)). In some embodiments, the substrate is flexible. In some embodiments, the substrate is suitable for roll-to-roll processing. In some embodiments, providing the substrate includes providing, to a roll-to-roll processing apparatus, the substrate as a roll (e.g., as a reel).

In some embodiments, the method 500 further includes fabricating the partial OLED stack using solution-based processing to form each layer in the partial OLED stack, including depositing a transparent conductive layer using solution-based processing to form an anode for the partial OLED stack. In some embodiments, the method 500 includes fabricating the partial OLED stack using solution-based processing to form one or more (e.g., less than all) of the layers, and/or to form most of the layers (e.g., using the roll-to-roll processes described herein).

Note that, in some circumstances (e.g., as with the description of method 400, above), the substrate may be considered part of the OLED stack. Thus, the "partial OLED stack" refers to a second part of the OLED stack distinct from the substrate.

In some embodiments, the OLED stack includes (504) an anode comprising a material other than indium tin oxide (ITO) (e.g., the anode does not include ITO). In some embodiments, the anode comprises a conductive material in an organic matrix. In some embodiments, the anode comprises silver nanowires in an organic matrix (e.g., a plastic matrix). In some embodiments, the organic matrix is a cured epoxy. In some embodiments, in addition to the anode, the OLED stack includes one or more electronically-active layers.

In some embodiments, the partial OLED stack is (506) part of a bottom-emitting OLED stack. (e.g., the OLED stack emits light through the substrate, and thus, the substrate serves functionally as a superstrate). In some embodiments, the partial OLED stack includes (508), in order of proximity to the substrate, one or more of, or a plurality of of, or three or more of: an anode; a hole injection layer; a hole transport layer; a light emission layer; an electron transport layer; and/or an electron injection layer. In some embodiments, one or more of these layers is omitted and/or the function of two or more of these layers is combined or embodied in a single layer. For example, in some embodiments, the partial OLED stack includes only an anode and a light emitting layer, upon which the cathode is fabricated. In some embodiments, the anode is (510) a transparent conductive layer (e.g., a transparent conductive film).

In some embodiments, the partial OLED stack covers (512) a contiguous area on the substrate that is at least 1 cm² (or 4 cm², or 10 cm²). Stated another way, method 500 produces a large-area OLED. Large area OLEDs require high-conductivity in their electrodes, otherwise the device would experience a significant voltage drop from one side of an electrode (e.g., anode or cathode) to the other). The result is that, in use, one side of the OLED would emit more light than the other. To avoid this problem, in some embodiments, method 500 is used for fabricating a cathode that has a conductivity between 0.001-1.0Ω/☐/mil. In some embodiments, the conductivity is above 0.001Ω/☐/mil.

The method 500 includes depositing (514), on top of the partial OLED stack, a solution comprising a metal compound. In some embodiments, the metal compound comprises a silver (Ag) compound or an aluminum (Al) compound. In some embodiments, the metal compound is in the form of conductive particles. In some embodiments, the conductive particles are conductive metallic particles (e.g., Ag or Al particles, where the metal is in a metallic, zero oxidation, state). In some embodiments, the conductive particles are conductive nanoparticles (e.g., particles with a mean diameter less than a micron).

In some embodiments, the solution comprising the metal compound is deposited using roll-to-roll processing. For example, the solution comprises an ink for a roll-to-roll processing technique.

In some embodiments, the solution comprises (516) a non-polar solvent. In some embodiments, the solution comprises (518) an aliphatic solvent (e.g., the aliphatic solvent includes C14-C16 molecules). In some embodiments, the metal compound comprises (520) conductive particles functionalized to be soluble in the non-polar solvent. For example, for aliphatic solvents, the conductive particles can be functionalized to include the same carbon chains that comprise the solvent (e.g., C14-C16 chains).

In some embodiments, each layer of the plurality of layers of the partial OLED stack is insoluble to the non-polar solvent (e.g., either because the layer has been cross-linked or the layer was never soluble in the non-polar solvent). In some embodiments, flash-curing, as described with reference to method 400 (FIG. 4), is used to cross-link a layer that would otherwise be soluble in the non-polar solvent.

The method 500 includes forming (522) a conductive solid layer from the metal compound in the solution to form a cathode for the partial OLED stack. In some embodiments, forming the cathode completes an electronically-functional OLED (although additional layers, such as a barrier layer or a laminate, may be added for protection).

In some embodiments, the metal compound comprises (524) conductive particles. Forming the conductive solid layer from the solution to form the cathode for the partial OLED stack comprises thermally curing (e.g., sintering) the solution. Thus, in such embodiments, the resulting cathode comprises a plurality of sintered conductive particles (e.g., the resulting cathode is a porous metallic layer). Note that, depending on the level of the sintering, the conductive particles may not be individually identifiable after the thermal curing.

In some embodiments, the cathode is deposited from the solution using a Tollens' reaction. To that end, the solution includes (526) a reducing agent (e.g., a reducing sugar). Forming the conductive solid layer from the solution to form the cathode for the partial OLED stack comprises reducing a metal (e.g., Al or Ag) in the metal compound to precipitate the metal out of the solution. In some embodiments, in the solution, the metal is a non-neutral metal (e.g., in a non-zero oxidation state) and is thus not in a metallic form. Rather, in the solution, the metal is part of a larger molecule (albeit a possibly dissolved molecule), such as a salt.

In some embodiments, the cathode is (528) reflective.

Note that, as used herein, when a first layer is described as "over" a second layer, it is not meant to imply that the first layer is directly on top of the second layer, unless expressly stated. Rather, a first layer is over a second layer when the first layer is distal to a substrate (e.g., with respect to deposition) from the second layer. Stated another way, a first layer is over a second layer when the first layer is deposited subsequently to the second layer. One or more intervening layers may be disposed between the second layer and the first layer, which is over the second layer.

Further, as used herein, the term "substrate" is used to refer to an underlying substance or layer on which additional device layers are fabricated. It should be understood, however, that such a layer may serve as a substrate for fabrication purposes, but as a superstrate in terms of the device's functionality.

The foregoing description, for purposes of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

It will be understood that, although the terms "first," "second," etc. may be used herein to describe various elements, these elements should not be limited by these terms. These terms are only used to distinguish one element from another. For example, a first instance of a layer of material could be termed a second instance of the layer of material, and, similarly, a second first instance of the layer of material could be termed a first instance of the layer of material, without changing the meaning of the description, so long as all occurrences of the "first instance of the layer of material" are renamed consistently and all occurrences of the "second instance of the layer of material" are renamed consistently. The first instance of the layer of material and the second first instance of the layer of material are both instances of the layer of material, but they are not the same instance of the layer of material.

The terminology used herein is for the purpose of describing particular implementations only and is not intended to be limiting of the claims. As used in the description of the implementations and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "upon a determination that" or "in response to determining" or "in accordance with a determination" or "upon detecting" or "in response to detecting" that the stated condition precedent is true, depending on the context.

What is claimed is:

1. A method, comprising:
   providing a stack of layers including:
      a substrate and one or more electronically-active layers disposed on a surface of the substrate; and
      a thermally-curable layer of organic material comprising a polymer or polymerizable material applied over the one or more electronically-active layers, including a respective organic layer of the one or more electronically-active layers; and
   illuminating, for less than a thermalization time of the stack of layers, a surface of the stack of layers to initiate a non-equilibrium thermal process that includes raising a temperature of the thermally-curable layer of organic material, comprising the polymer or polymerizable material, above a first temperature for a length of time sufficient to polymerize and/or cross-link the thermally-curable layer of organic material while maintaining the one or more electronically-active layers, including the respective organic layer, below a second temperature that is less than the first temperature, wherein:
      the one or more electronically-active layers is robust to temperatures below the second temperature, and
      the second temperature is a glass transition temperature for the respective organic layer in the one or more electronically-active layers.

2. The method of claim 1, wherein the stack of layers includes a partial organic light emitting diode (OLED) stack.

3. The method of claim 1, wherein the stack of layers includes a partial stack for an organic photovoltaic.

4. The method of claim 1, wherein:
   the thermally-curable layer of material comprises a cross-linkable material; and
   performing the non-equilibrium thermal process includes cross-linking the cross-linkable material.

5. The method of claim 1, wherein:
   the thermally-curable layer of material comprises a polymerizable material; and
   performing the non-equilibrium thermal process includes polymerizing the polymerizable material.

6. The method of claim 1, wherein:
   the thermally-curable layer of material is a thermally-activateable doped layer that includes a semiconducting polymer host material and a dopant; and
   performing the non-equilibrium thermal process includes thermally-activating the thermally-activateable doped layer.

7. The method of claim 1, wherein the length of time sufficient to polymerize and/or cross-link the thermally-curable layer of material at the first temperature is under 10 seconds, under 20 seconds, or under a minute, or under 10 minutes.

8. The method of claim 7, wherein a length of time sufficient to polymerize and/or cross-link the thermally-curable layer of material at the second temperature is over 10 minutes, over an hour, over two hours, over eight hours, over 12 hours, or over 24 hours.

9. The method of claim 1, wherein:
the second temperature is a temperature that would cause a first amount of thermal deformation in a first layer in the stack of layers; and
the first amount of thermal deformation would cause a second layer in the one or more electronically-active layers, different from the first layer, to crack or warp.

10. The method of claim 9, wherein the first layer is the substrate.

11. The method of claim 9, wherein the thermal deformation is plastic deformation.

12. The method of claim 1, wherein the thermally-curable layer of material is an electronically active layer of material.

13. The method of claim 1, wherein:
the non-equilibrium thermal process results in producing a thermally-cured layer of material from the thermally-curable layer of material; and
the method further includes:
packaging an electronic device that includes the thermally-cured layer of material and an electrode disposed between the substrate and the thermally-cured layer of material, wherein the thermally-cured layer of material is a respective layer in an electronically-active stack of layers that includes the electrode.

14. A method, comprising:
providing a stack of layers including:
a substrate and one or more electronically-active layers disposed on a surface of the substrate;
a thermally-curable layer of organic material comprising a polymer or polymerizable material applied over the one or more electronically-active layers; and
illuminating, for less than a thermalization time of the stack of layers, a surface of the stack of layers to initiate a non-equilibrium thermal process that includes raising a temperature of the thermally-curable layer of organic material comprising the polymer or polymerizable material, above a first temperature for a length of time sufficient to polymerize and/or cross-link the thermally-curable layer of organic material while maintaining the one or more electronically-active layers below a second temperature that is less than the first temperature, wherein:
the one or more electronically-active layers is robust to temperatures below the second temperature, and
maintaining the stack of layers at the first temperature for the length of time sufficient to polymerize and/or cross-link the thermally-curable layer of organic material would render a respective organic layer of the one or more electronically-active layers inoperative.

15. A method, comprising:
providing a stack of layers including:
a substrate and one or more electronically-active layers disposed on a surface of the substrate;
a thermally-curable layer of organic material comprising a polymer or polymerizable material applied over the one or more electronically-active layers; and
illuminating, for less than a thermalization time of the stack of layers, a surface of the stack of layers to initiate a non-equilibrium thermal process that includes raising a temperature of the thermally-curable layer of organic material comprising the polymer or polymerizable material, above a first temperature for a length of time sufficient to polymerize and/or cross-link the thermally-curable layer of organic material while maintaining the one or more electronically-active layers below a second temperature that is less than the first temperature, wherein:
the one or more electronically-active layers is robust to temperatures below the second temperature, and
the second temperature is a bulk damage threshold temperature.

16. A method, comprising:
providing a stack of layers including:
a substrate and one or more electronically-active layers disposed on a surface of the substrate;
a thermally-curable layer of organic material comprising a polymer or polymerizable material applied over the one or more electronically-active layers; and
illuminating, for less than a thermalization time of the stack of layers, a surface of the stack of layers to initiate a non-equilibrium thermal process that includes raising a temperature of the thermally-curable layer of organic material comprising the polymer or polymerizable material, above a first temperature for a length of time sufficient to polymerize and/or cross-link the thermally-curable layer of organic material while maintaining the one or more electronically-active layers below a second temperature that is less than the first temperature, wherein:
the one or more electronically-active layers is robust to temperatures below the second temperature, and
the second temperature is a temperature that would cause a respective organic layer in the one or more electronically-active layers to crack or warp.

* * * * *